US012652931B2

(12) United States Patent
Im et al.

(10) Patent No.: US 12,652,931 B2
(45) Date of Patent: Jun. 9, 2026

(54) DISPLAY DEVICE INCLUDING MULTI-BODY UNIT STRUCTURES

(71) Applicant: Samsung Display Co., LTD., Yongin-si (KR)

(72) Inventors: Daehyuk Im, Yongin-si (KR); Youngmin Ahn, Yongin-si (KR); Sun Oh Jeong, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 370 days.

(21) Appl. No.: 18/233,977

(22) Filed: Aug. 15, 2023

(65) Prior Publication Data

US 2024/0122036 A1 Apr. 11, 2024

(30) Foreign Application Priority Data

Oct. 6, 2022 (KR) ........................ 10-2022-0127625

(51) Int. Cl.
*H10K 59/80* (2023.01)
*H10K 59/121* (2023.01)
*H10K 59/122* (2023.01)
*H10K 50/842* (2023.01)
*H10K 50/844* (2023.01)
(Continued)

(52) U.S. Cl.
CPC ..... *H10K 59/8722* (2023.02); *H10K 59/1213* (2023.02); *H10K 59/122* (2023.02); *H10K 59/873* (2023.02); *H10K 50/8426* (2023.02); *H10K 50/844* (2023.02); *H10K 59/12* (2023.02); *H10K 59/124* (2023.02); *H10K 2102/311* (2023.02)

(58) Field of Classification Search
CPC .. H10K 59/8722; H10K 59/873; H10K 59/40; H10K 59/123; H10K 59/122; H10K 59/124; H10K 59/1213; H10K 59/12; H10K 50/84; H10K 50/81; H10K 50/82; H10K 50/844; H10K 50/8426; H10K 77/111; H10H 29/142; H10H 20/853; H10H 20/857
See application file for complete search history.

(56) References Cited

U.S. PATENT DOCUMENTS

| | | | | |
|---|---|---|---|---|
| 2018/0095217 A1* | 4/2018 | Min | ......................... | G02B 1/14 |
| 2022/0084936 A1* | 3/2022 | Qian | ..................... | H01L 23/528 |
| 2022/0228039 A1* | 7/2022 | Nomoto | .................. | C09J 7/403 |

FOREIGN PATENT DOCUMENTS

| | | | | | |
|---|---|---|---|---|---|
| CN | 111511957 A | * | 8/2020 | ........... | H10K 71/166 |
| CN | 109411520 B | * | 11/2020 | ............. | G09F 9/301 |

* cited by examiner

*Primary Examiner* — Ida M Soward
(74) *Attorney, Agent, or Firm* — CANTOR COLBURN LLP

(57) ABSTRACT

A display device includes: a display panel, a protective film disposed under a display panel, and an adhesive layer disposed between a display panel and the protective film. The adhesive layer includes: a base structure including a plurality of first unit structures and a plurality of second unit structures; and an adhesive material filling an inner space of a base structure. Each of first unit structures includes a first body, a second body in contact with a first body, and a first through-hole penetrating a side wall shared by a first body and a second body, and each of the second unit structures includes a third body, a fourth body in contact with a third body, and a second through-hole penetrating a side wall shared by a third body and a fourth body.

20 Claims, 10 Drawing Sheets

(51) Int. Cl.

| | |
|---|---|
| *H10K 59/12* | (2023.01) |
| *H10K 59/124* | (2023.01) |
| *H10K 102/00* | (2023.01) |

WIN
POL
SL
PNL
AL
PFM
CL

BPL

PS1

PS2

OP

AL    PFM

DA

BA

PA

II

III

DR2
DR1

F I G . 6
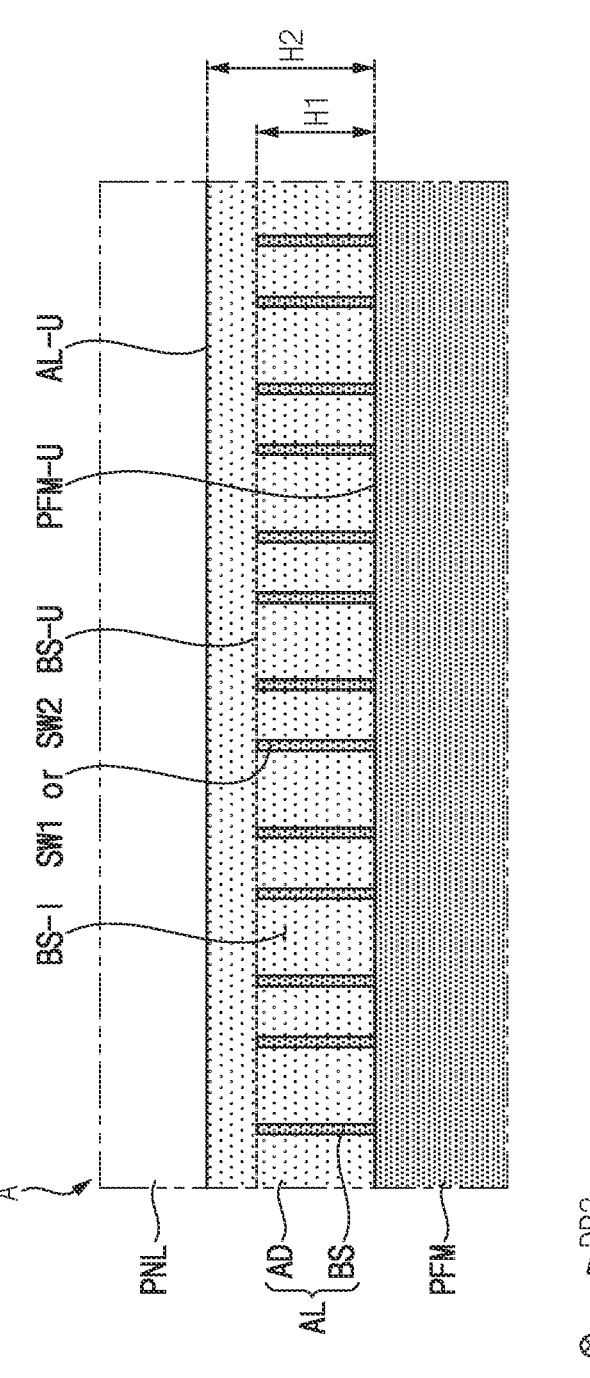

DISPLAY DEVICE INCLUDING MULTI-BODY UNIT STRUCTURES

This application claims priority to Korean Patent Application No. 10-2022-0127625, filed on Oct. 6, 2022, and all the benefits accruing therefrom under 35 U.S.C. § 119, the content of which in its entirety is herein incorporated by reference.

BACKGROUND

1. Field

Embodiments of the invention relate to a display device.

2. Description of the Related Art

As information technology develops, importance of a display device, which is communication media between users and information, is being highlighted. Accordingly, the use of the display device such as a liquid crystal display device, an organic light emitting display device, a plasma display device, or the like is increasing.

Meanwhile, by bending at least a portion of the display device, visibility at various angles may be improved or the area of the non-display area may be reduced. In the process of manufacturing such a display device in which at least a portion is bent, a method of minimizing defects has been sought.

SUMMARY

Embodiments provide a display device with an improved durability.

A display device according to an embodiment includes: a display panel, a protective film disposed under the display panel, and an adhesive layer disposed between the display panel and the protective film. The adhesive layer includes a base structure including a plurality of first unit structures and a plurality of second unit structures and an adhesive material filling an inner space of the base structure. Each of the first unit structures includes a first body, a second body in contact with the first body, and a first through-hole penetrating a side wall shared by the first body and the second body, and each of the second unit structures includes a third body, a fourth body in contact with the third body, and a second through-hole penetrating a side wall shared by the third body and the fourth body.

In an embodiment, the first unit structures and the second unit structures may be disposed such that the first through-hole and the second through-hole are repeatedly arranged in a first direction and a second direction perpendicular to the first direction in a plan view.

In an embodiment, the first through-hole and the second through-hole may be alternately arranged along rows and columns in a plan view.

In an embodiment, the adhesive material may flow through the first through-hole and the second through-hole.

In an embodiment, the second body may be in contact with the first body in a third direction inclined with respect to the first direction in a plan view, and the fourth body may be in contact with the third body in a fourth direction inclined with respect to the first direction to be symmetrical to the third direction in a plan view.

In an embodiment, the adhesive material may flow in the third direction and in a direction opposite to the third direction through the first through-hole, and may flow in the fourth direction and in a direction opposite to the fourth direction through the second through-hole.

In an embodiment, a first height from an upper surface of the protective film to an upper surface of the base structure may be lower than a second height from the upper surface of the protective film to an upper surface of the adhesive layer.

In an embodiment, a ratio of the first height to the second height may be about 0.5 to about 0.8.

In an embodiment, the base structure may include the same material as the protective film.

In an embodiment, the base structure may be monolithic with the protective film.

In an embodiment, the base structure may have a mesh structure in a plan view.

In an embodiment, the mesh structure may have a polygonal shape.

In an embodiment, the polygonal shape may be a hexagonal shape.

In an embodiment, each of the first through-hole and the second through-hole may have a polygonal shape, a diamond shape, a circular shape, a track shape, or an elliptical shape.

In an embodiment, the display panel may include a display area, a pad area spaced apart from the display area, and a bending area located between the display area and the pad area and bent from the display area.

In an embodiment, the display device may further include: a sensing layer disposed on a first surface of the display panel and overlapping the display area and a pad part disposed on the first surface of the display panel and overlapping the pad area, and the protective film may be disposed on a second surface of the display panel opposite to the first surface.

In an embodiment, the display panel may include: a transistor electrically connected to the pad part, a pixel electrode disposed on the transistor and connected to the transistor, an emission layer disposed on the pixel electrode, a common electrode disposed on the emission layer, and an encapsulation layer disposed on the common electrode and including at least one inorganic encapsulation layer and at least one organic encapsulation layer.

In an embodiment, the display panel may include a folding area and a flat area adjacent to the folding area.

In an embodiment, the display device may further include a support member disposed under the protective film and having a plurality of holes overlapping the folding area.

A display device according to embodiments may include the protective film and the adhesive layer disposed under a display panel. In addition, the adhesive layer may include the base structure and the adhesive material, and the base structure may have the first through-hole and the second through-hole through which the adhesive material flows in a specific direction. The first through-hole and the second through-hole may allow the adhesive material to flow symmetrically with each other. Accordingly, even when the adhesive material flows, the flow of the adhesive material may not substantially appear on the entire adhesive layer. Accordingly, deformation of the adhesive layer may be effectively reduced or prevented. Therefore, defects of the display device due to deformation of the adhesive layer may be reduced or prevented. Accordingly, durability of the display device may be effectively improved.

It is to be understood that both the foregoing general description and the following detailed description are exemplary and explanatory and are intended to provide further explanation of the invention as claimed.

BRIEF DESCRIPTION OF THE DRAWINGS

Illustrative, non-limiting embodiments will be more clearly understood from the following detailed description taken in conjunction with the accompanying drawings.

FIG. 4 is a cross-sectional view taken along line of FIG. 1

FIG. 6 is an enlarged view illustrating an enlarged area 'A' of FIG. 2.

FIG. 10 is a plan view illustrating a base structure included in an adhesive layer of FIG. 6 according to another embodiment.

DETAILED DESCRIPTION

Figure 1:
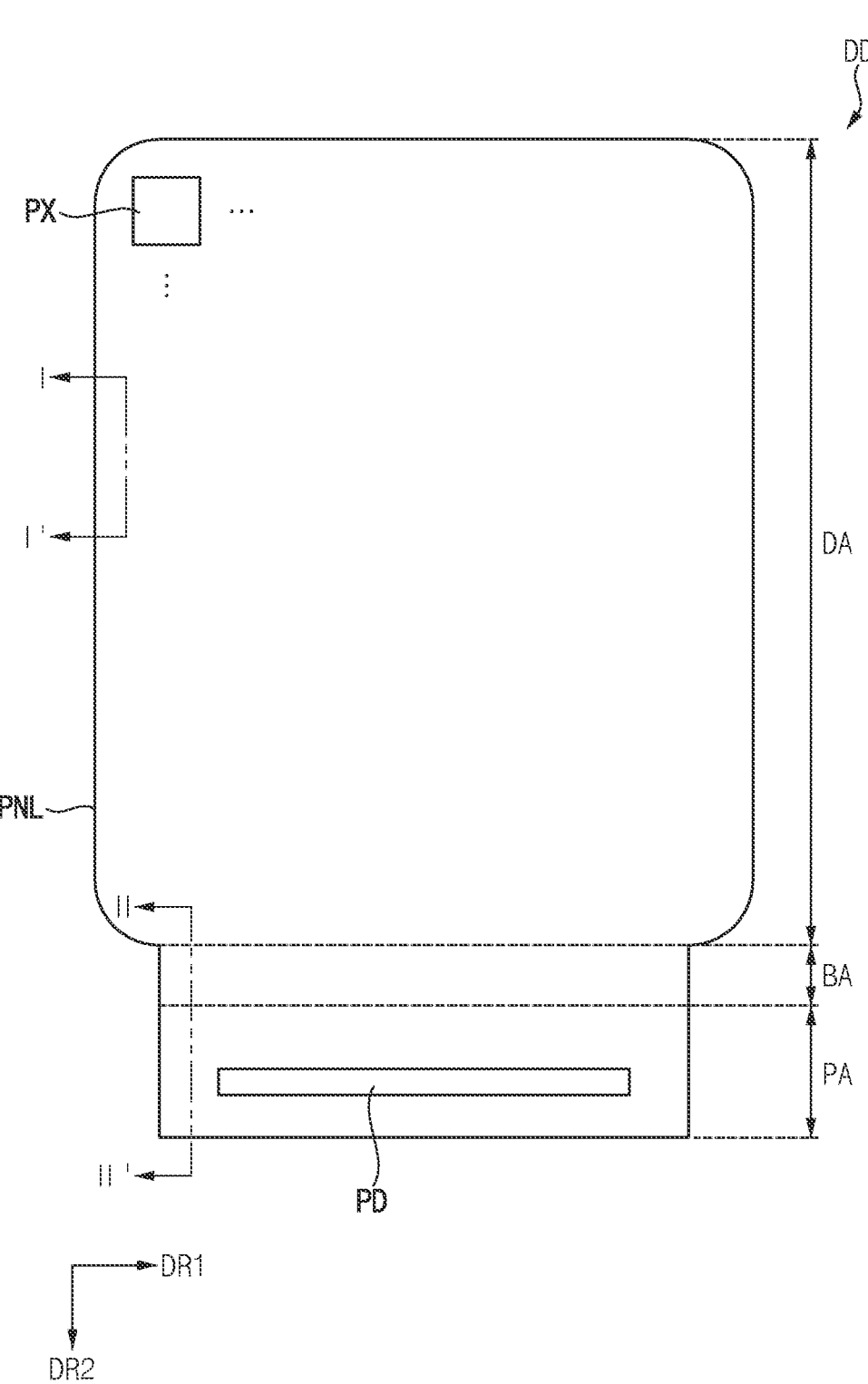
FIG. 1 is a plan view illustrating a display device according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Figure 2:
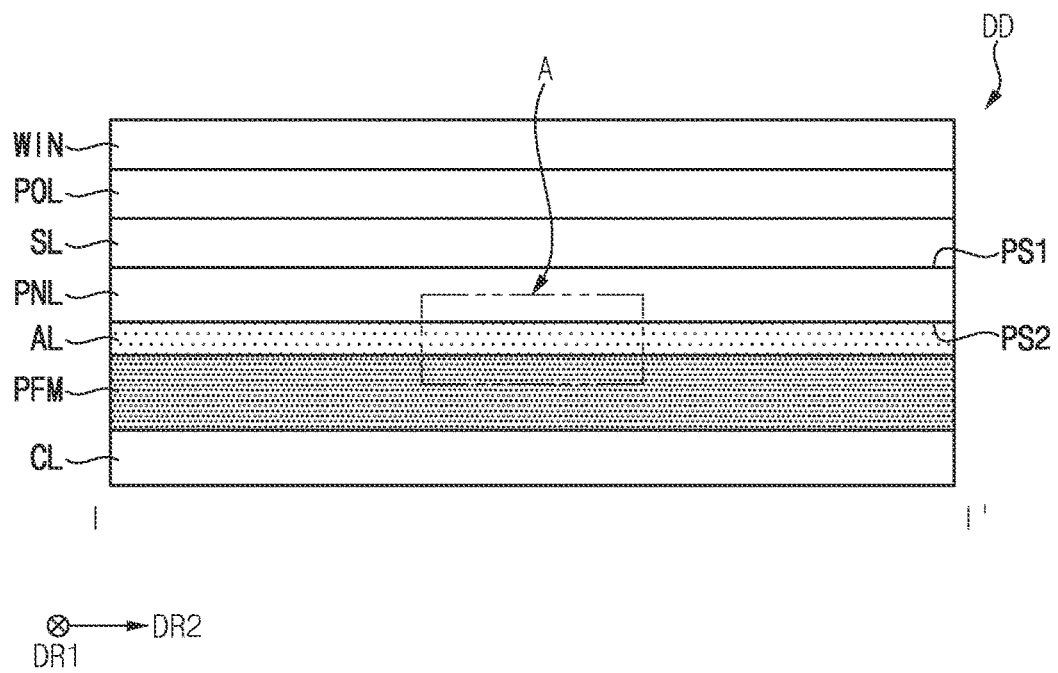
FIG. 2 is a cross-sectional view taken along line I-I' of FIG. 1.

FIG. 1 is a plan view illustrating a display device according to an embodiment, and FIG. 2 is a cross-sectional view taken along line I-I' of FIG. 1.

Referring to FIGS. 1 and 2, the display device DD may include a display panel PNL, a sensing layer SL, a polarization layer POL, a window WIN, a bending protection layer BPL, an adhesive layer AL, a protective film PFM, and a cushion layer CL.

The display device DD may display an image. For example, the display device DD may be an organic light emitting display. However, the display device DD of the present invention is not limited thereto, and may be a display device of various types that can be bent.

The display device DD (e.g., the display panel PNL) may include a display area DA, a pad area PA, and a bending area BA. In FIG. 1, each of the display area DA, the pad area PA, and the bending area BA is illustrated as having a rectangular planar shape with two sides extending in a first direction DR1 and two sides extending in a second direction DR2 perpendicular to the first direction DR1, but the present invention is not necessarily limited thereto. In this specification, the first direction DR1 and the second direction DR2 may define a plane.

At least one pixel structure PX may be disposed in the display area DA, and the image may be displayed through the pixel structure PX in the display area DA. The pixel structure PX may include a driving device (e.g., a transistor) and a light emitting device (e.g., an organic light emitting diode) connected to the driving device. The light emitting device may emit light by receiving a signal and/or voltage from the driving device. For example, the driving device may provide a driving current to the light emitting device, and the light emitting device may generate light having a luminance corresponding to the driving current. The pixel structure PX may be generally disposed in the display area DA. For example, the pixel structure PX may be arranged in a matrix form in the display area DA.

The pad area PA may be located on one side of the display area DA and may be spaced apart from the display area DA. For example, the pad area PA may be spaced apart from the display area DA in the second direction DR2. In an embodiment, a width of the pad area PA in the first direction DR1 may be smaller than a width of the display area DA in the first direction DR. Various electronic devices such as an integrated circuit ("IC") or a printed circuit board may be electrically attached to the pad area PA. For example, a pad part PD and a data driver DDV may be disposed in the pad area PA. The pad part PD may include a plurality of pads, and the pads may receive electrical signals from the outside.

Figure 5:
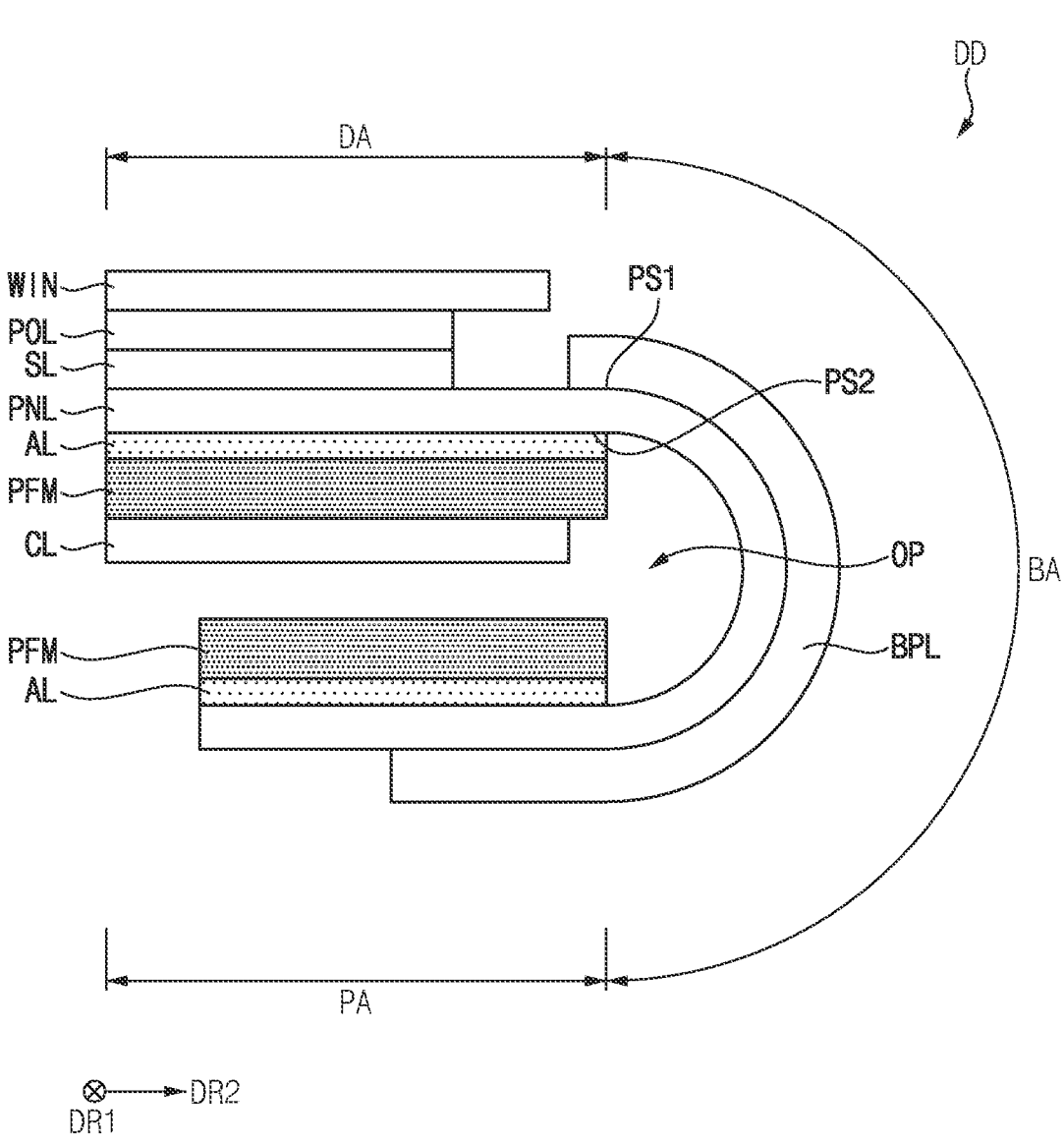
FIG. 5 is a cross-sectional view illustrating a bent state of the display device of FIG. 4.

The bending area BA may be located between the display area DA and the pad area PA. In an embodiment, a width of the bending area BA in the first direction DR1 may be smaller than a width of the display area DA in the first direction DR. For example, as shown in FIG. 5, the bending area BA may be bent based on a virtual bending axis extending in the first direction DR1. Accordingly, the display device DD (e.g., the display panel PNL) may be bent.

Meanwhile, in FIG. 1, the data driver DDV is illustrated as being mounted in the pad area PA of the display panel PNL, but the present invention is not necessarily limited thereto. For example, a separate flexible printed circuit board ("FPCB") may be disposed in the pad area PA, and the data driver DDV may be disposed on the flexible printed circuit board. In this case, the pad part PD may be electrically connected to the flexible printed circuit board.

The sensing layer SL may be disposed on a first surface PS1 of the display panel PNL. For example, the first surface PS1 may be an upper surface of the display panel PNL. In other words, the sensing layer SL may be disposed on the display panel PNL. The sensing layer SL may include a plurality of sensing electrodes and may sense a user's touch.

The polarization layer POL may be disposed on the sensing layer SL. The polarization layer POL may reduce reflection of external light of the display device DD. For example, when external light is reflected from a lower portion of the polarization layer POL (e.g., display panel PNL) by passing through the polarization layer POL, and then passes through the polarization layer POL again, a phase of the external light may change. Accordingly, since the phase of the reflected light is different from the phase of the incident light entering the polarization layer POL, destructive interference may occur, and the reflection of external light may be reduced, thereby improving visibility of the display device DD.

The window WIN may be disposed on the polarization layer POL. The window WIN may protect the display panel PNL from external impurities, impact, or the like. In an embodiment, the window WIN may include flexible transparent glass or transparent plastic. For example, the window WIN may include ultra-thin tempered glass ("UTG") or polyimide ("P1"). When the display device DD is bent, the window WIN having flexibility may also be bent. Although not shown in FIG. 2, functional layers such as an antireflection layer, a hard coating layer, and an anti-fingerprint layer may also be disposed on the window WIN.

The protective film PFM may be disposed on the second surface PS2 of the display panel PNL. The second surface PS2 may be a surface opposite to the first surface PS1. For example, the second surface PS2 may be a lower surface of the display panel PNL. That is, the protective film PFM may be disposed under the display panel PNL. The protective film PFM may absorb an external impact from the lower part of the display device DD. Accordingly, the protective film PFM may protect the second surface PS2 of the display panel PNL from external impact.

The protective film PFM may include glass or plastic. For example, examples of materials that can be used as the protective film PFM may include ultra-thin tempered glass (UTG), polyethylene terephthalate ("PET"), polyimide (PI), polyethersulfone ("PS"), polyacrylate ("PAR"), polyetherimide ("PEI"), polyethylene naphthalate ("PEN"), polyphenylene sulfide ("PPS"), polyarylate, polycarbonate ("PC"), polyarylene ether sulfone, or the like.

The adhesive layer AL may be disposed between the display panel PNL and the protective film PFM. The adhesive layer AL may adhere the protective film PFM to the display panel PNL. A structure of the adhesive layer AL will be described later in detail with reference to FIG. 6.

The cushion layer CL may be disposed under the protective film PFM. The cushion layer CL may be disposed under the display panel PNL to mitigate an impact of the display panel PNL. For example, the cushion layer CL may include a material capable of buffering by containing air, such as a cushion or a sponge. In addition, the cushion layer CL may include acrylic resin, polyurethane, thermoplastic polyurethane, latex, polyurethane foam, polystyrene foam, or the like. The cushion layer CL may have a foam shape or a gel shape.

Figure 3:
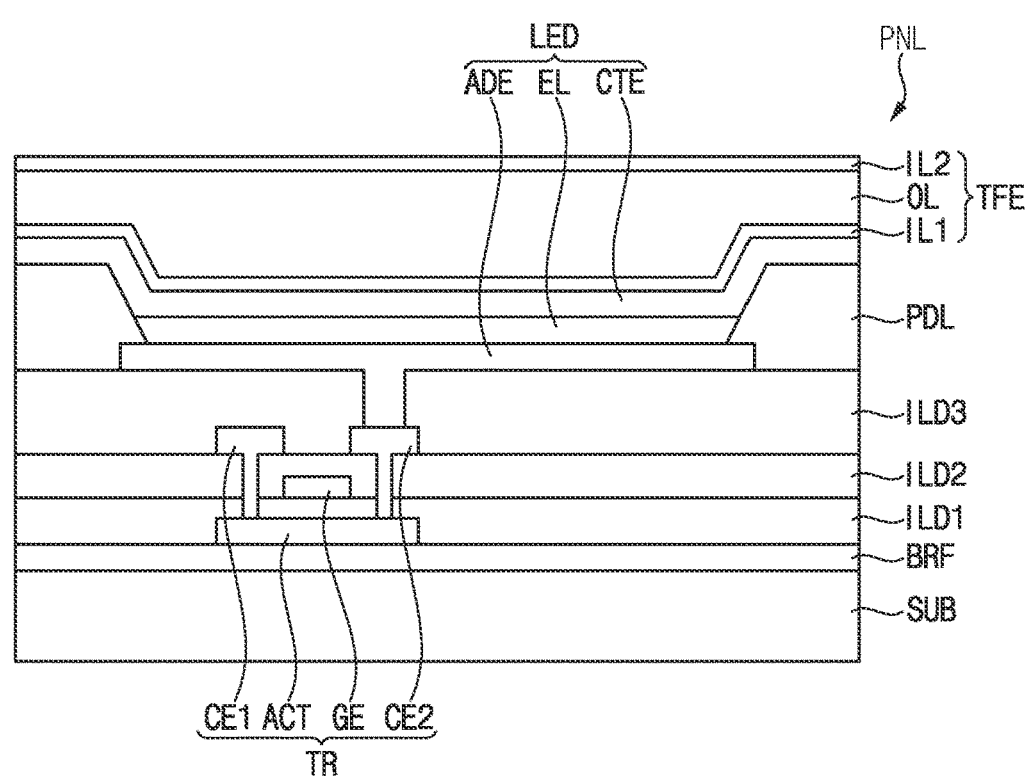
FIG. 3 is a cross-sectional view illustrating a display panel included in a display device of FIG. 2.

FIG. 3 is a cross-sectional view illustrating a display panel included in a display device of FIG. 2.

Referring to FIG. 3, the display panel PNL may include a substrate SUB, a buffer layer BFR, a transistor TR, first to third insulating layers ILD1, ILD2, and ILD3, a light emitting device LED, and pixel defining layer PDL, and an encapsulation layer TFE. The transistor TR may include an active pattern ACT, a gate electrode GE, a first connection electrode CE1 and a second connection electrode CE2. The transistor TR may be electrically connected to the pad part PD of FIG. 1. The light emitting device LED may include a pixel electrode ADE, an emission layer EL, and a common electrode CTE.

The substrate SUB may be formed of a transparent or opaque material. For example, the substrate SUB may be formed of glass, quartz, or plastic. Examples of plastics that can be used as the substrate SUB may include polyethylene terephthalate (PET), polyimide (PI), polyethersulfone (PS), polyacrylate (PAR), polyetherimide (PEI), and polyethylene naphthalate. (PEN), polyphenylene sulfide (PPS), polyarylate, polycarbonate (PC), polyarylene ether sulfone, or the like. In this case, the substrate SUB may include a plurality of polyimide layers and barrier layers disposed between the polyimide layers.

The buffer layer BFR may be disposed on the substrate SUB. In an embodiment, the buffer layer BFR may include an inorganic material. For example, materials that can be used as the buffer layer BFR may include silicon oxide, silicon nitride, or silicon oxynitride. These may be used alone or in combination with each other.

The buffer layer BFR may prevent diffusion of metal atoms or impurities from the substrate SUB into the active pattern ACT. Also, the buffer layer BFR may control a heat supply rate during a crystallization process for forming the active pattern ACT.

The active pattern ACT may be disposed on the buffer layer BFR. In an embodiment, the active pattern ACT may be a silicon semiconductor or an oxide semiconductor. For example, examples of materials that can be used as the active pattern ACT may include amorphous silicon, polycrystalline silicon, or metal oxide. These may be used alone or in combination with each other.

The first insulating layer ILD1 may be disposed on the active pattern ACT. The first insulating layer ILD1 may be formed of an insulating material. Examples of an insulating material that can be used as the first insulating layer ILD1 may include silicon oxide, silicon nitride, or silicon oxynitride. These may be used alone or in combination with each other. In an embodiment, as shown in FIG. 3, the first insulating layer ILD1 may be entirely formed on the buffer layer BFR to cover the active pattern ACT. However, the present invention is not necessarily limited thereto, and in another embodiment, the first insulating layer ILD1 may be disposed on the active pattern ACT in a pattern form.

The gate electrode GE may be disposed on the first insulating layer ILD1 and may overlap the active pattern ACT in a plan view. In an embodiment, the gate electrode GE may include a metal, an alloy, a conductive metal oxide, a transparent conductive material, or the like.

The second insulating layer ILD2 may cover the gate electrode GE and may be disposed on the buffer layer BFR. In an embodiment, the second insulating layer ILD2 may include an inorganic insulating material. For example, examples of materials that can be used as the second insulating layer ILD2 may include silicon oxide, silicon nitride, or silicon oxynitride. These may be used alone or in combination with each other.

The first connection electrode CE1 and the second connection electrode CE2 may be disposed on the second insulating layer ILD2. The first connection electrode CE1 and the second connection electrode CE2 may contact the active pattern ACT. The first connection electrode CE1 and the second connection electrode CE2 may include a metal such as aluminum (Al), titanium (Ti), or copper (Cu).

The third insulating layer ILD3 may be disposed on the first connection electrode CE1 and the second connection electrode CE2. The third insulating layer ILD3 may include an organic insulating material such as polyimide and/or an inorganic insulating material such as silicon nitride or silicon oxide. The third insulating layer ILD3 may have a multilayer structure.

The pixel electrode ADE may be disposed on the third insulating layer ILD3. The pixel electrode ADE may be connected to the first connection electrode CE1 or the second connection electrode CE2. The pixel electrode ADE may be formed of a metal such as magnesium (Mg), silver (Ag), gold (Au), calcium (Ca), lithium (Li), chromium (Cr), aluminum (Al), or the like and/or transparent conductive oxide such as indium tin oxide (ITO), indium zinc oxide (IZO), zinc oxide (ZnO), or the like.

The pixel defining layer PDL may be disposed on the pixel electrode ADE. In an embodiment, the pixel defining layer PDL may include an organic insulating material. A pixel opening exposing an upper surface of the pixel electrode ADE may be formed in the pixel defining layer PDL.

The emission layer EL may be disposed on the pixel electrode ADE exposed by the pixel opening. In an embodiment, the emission layer EL may be separated from the emission layer of an adjacent pixel. In another embodiment, the emission layer EL may continuously extend on the pixel electrode ADE and the pixel defining layer PDL.

In an embodiment, the emission layer EL may have a multilayer structure in which a plurality of layers is stacked. For example, when the emission layer EL generates blue light, the emission layer EL may have a structure in which a plurality of blue organic light emitting layers is stacked. In another embodiment, the emission layer EL may have a multilayer structure in which a plurality of layers emitting light of different colors is stacked. For example, when the emission layer EL generates blue light, the emission layer EL may have a structure in which a plurality of blue organic light emitting layers and an organic light emitting layer emitting light of a color other than blue are stacked. For example, the emission layer EL may have a structure in which three blue organic light emitting layers and one green organic light emitting layer are stacked.

The common electrode CTE may be disposed on the emission layer EL. The common electrode CTE may include a conductive material such as a metal, an alloy, a conductive metal nitride, a conductive metal oxide, or a transparent conductive material. The common electrode CTE may have a single-layer structure or a multi-layer structure including a plurality of conductive layers. The emission layer EL may emit light based on a voltage difference between the pixel electrode ADE and the common electrode CTE.

The encapsulation layer TFE may be disposed on the common electrode CTE. The encapsulation layer TFE may include at least one inorganic encapsulation layer and at least one organic encapsulation layer. In an embodiment, the encapsulation layer TFE may include a first inorganic encapsulation layer IL1 disposed on the common electrode CTE, an organic encapsulation layer OL disposed on the first inorganic encapsulation layer ILL and a second inorganic encapsulation layer IL2 disposed on the organic encapsulation layer OL. The encapsulation layer TFE may prevent external substances from penetrating into the light emitting device LED.

Figure 4:
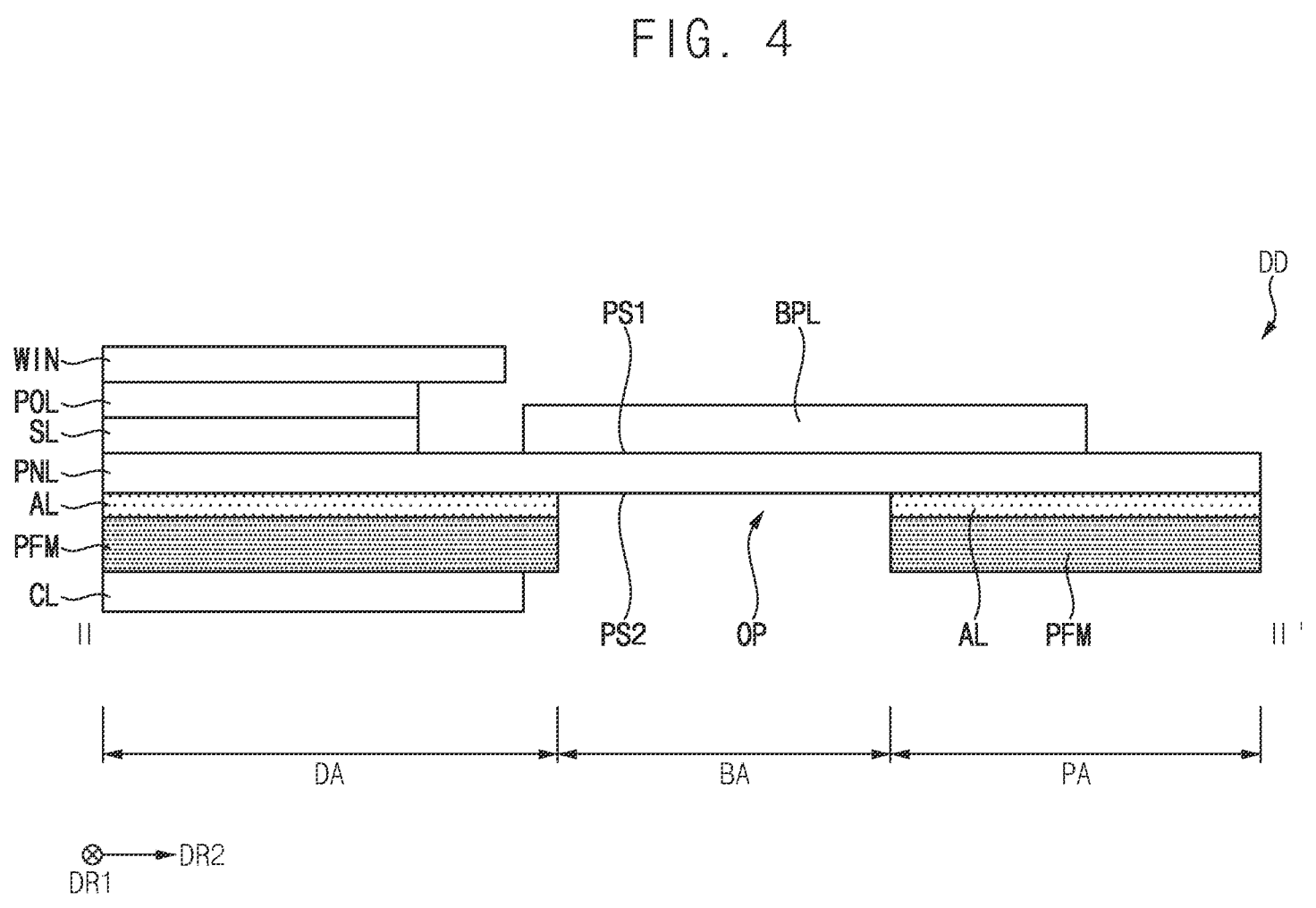

FIG. 4 is a cross-sectional view taken along line of FIG. 1, and FIG. 5 is a cross-sectional view illustrating a bent state of the display device of FIG. 4.

Referring to FIGS. 4 and 5, the bending area BA of the display panel PNL may be bent along the bending axis. For example, as shown in FIG. 5, the bending area BA may be bent so that the second surface PS2 of the display panel PNL faces each other and the display area DA and the pad area PA overlap.

In an embodiment, the adhesive layer AL and the protective film PFM may overlap the display area DA and the pad area PA in a plan view. The adhesive layer AL and the protective film PFM may define an opening OP therein overlapping the bending area BA. For example, the opening OP may penetrate the adhesive layer AL and the protective film PFM and expose the display panel PNL in the bending area BA. For example, the opening OP may expose a portion of the second surface PS2 of the display panel PNL in the bending area BA. The opening OP may prevent or reduce separation of the adhesive layer AL and the protective film PFM from the display panel PNL as the display panel PNL is bent.

In an embodiment, the cushion layer CL may overlap the display area DA in a plan view. For example, the cushion layer CL may not overlap the bending area BA. Also, although not shown in the drawing, a metal layer and a spacer may also be disposed under the cushion layer CL. The metal layer and the spacer may support the display panel PNL. The metal layer and the spacer may be disposed between the cushion layer CL and the protective film PFM which overlap each other when the display panel PNL is bent.

The bending protection layer BPL may be disposed on the bending area BA of the display panel PNL. That is, the bending protection layer BPL may be disposed on the first surface PS1 of the display panel PNL and may cover the bending area BA. In an embodiment, as shown in FIG. 4, a portion of the bending protection layer BPL may overlap a portion of the display area DA and/or the pad area PA of the display panel PNL. However, the present invention is not necessarily limited thereto, and the bending protection layer BPL may entirely overlap only with the bending area BA in another embodiment.

The bending protection layer BPL may protect the bending area BA of the display panel PNL. For example, the bending protection layer BPL may protect a conductive layer in the bending area BA of the display panel PNL. Wirings for transferring a driving signal to the display panel PNL may be disposed on the conductive layer. Tensile stress applied to the conductive layer may be reduced by adjusting a location of a stress neutral plane as the display device DD is bent according to an arrangement of the bending protection layer BPL. Also, the bending protection layer BPL may protect the bending area BA of the display panel PNL from static electricity introduced from the outside.

In an embodiment, as shown in FIGS. 4 and 5, the polarization layer POL and the bending protection layer BPL disposed on the first surface PS1 of the display panel PNL may be spaced apart from each other. Accordingly, when the polarization layer POL or the bending protection layer BPL is formed on the display panel PNL, occurrence of defects may be reduced. However, the present invention is not necessarily limited thereto, and in another embodiment, the polarization layer POL and the bending protection layer BPL may be formed to contact each other.

The window WIN may overlap the display area DA. For example, the window WIN may not overlap the bending area BA in a plan view. When the window WIN extends to overlap the bending area BA, a portion not supported by lower structures (e.g., polarization layer POL, display panel PNL, etc.) increases, and risk of damage to the window WIN may increase. Accordingly, in order to reduce the risk of damage, the window WIN may be extended by a length overlapping the display area DA, as shown in FIG. 4. However, the present invention is not necessarily limited thereto, and in another embodiment, a portion of the window WIN may extend to overlap the bending area BA.

FIG. 6 is an enlarged view illustrating an enlarged area 'A' of FIG. 2.

Referring to FIG. 6, the adhesive layer AL may include a base structure BS and an adhesive material AD.

In an embodiment, the base structure BS may be disposed on the protective film PFM. The base structure BS may include glass or plastic. Examples of materials that can be used as the base structure BS may include ultra-thin tempered glass (UTG), polyethylene terephthalate (PET), polyimide (PI), polyethersulfone (PS), polyacrylate (PAR), and polyetherimide. (PEI), polyethylene naphthalate (PEN), polyphenylene sulfide (PPS), polyarylate, polycarbonate (PC), polyarylene ether sulfone, or the like. In an embodiment, the base structure BS may include the same material as the protective film PFM.

In an embodiment, the base structure BS may be formed in a separate process from the protective film PFM and disposed on the protective film PFM. However, the present invention is not necessarily limited thereto, and the base structure BS may be formed together with the protective film PFM by the same process. For example, the base structure BS may be integrally formed (i.e., monolithic) with the protective film PFM. In this case, the base structure BS may continuously extend from an upper surface PFM-U of the protective film PFM.

In an embodiment, the base structure BS may have an inner space BS-I in which the adhesive material AD is accommodated. For example, the base structure BS may include a plurality of side walls (e.g., SW1 and SW2 in FIGS. 8 and 9) extending from the upper surface PFM-U of the protective film PFM toward a front of the display device DD, and the inner space BS-I may be defined from the side walls. In this case, the side walls may be side walls of each of unit structures of the base structure BS, which will be described later. In other words, the inner space BS-I of the base structure BS may be a set of inner spaces of each of the unit structures.

In an embodiment, the base structure BS may have a structure in which a portion corresponding to the inner space BS-I among an upper surface BS-U of the base structure BS is opened. Accordingly, the inner space BS-I of the base structure BS may be exposed to the outside. The adhesive material AD may be applied on the protective film PFM to fill the inner space BS-I of the base structure BS. Accordingly, the base structure BS and the adhesive material AD may define the adhesive layer AL.

In an embodiment, examples of the adhesive material AD may include a pressure sensitive adhesive ("PSA"), an optically clear adhesive ("OCA"), or an optically clear resin ("OCR").

On the other hand, although not shown, in another embodiment, the base structure BS may have a structure in which a portion corresponding to the inner space BS-I among the upper surface BS-U of the base structure BS is blocked. In other words, a separate upper wall may be disposed in the portion corresponding to the inner space BS-I among the upper surface BS-U of the base structure BS. In this case, the adhesive material AD in the inner space BS-I of the base structure BS and the adhesive material AD outside/above the base structure BS may be separated by the upper wall disposed in the upper surface BS-U. In an embodiment, the upper wall may be formed integrally with the side walls of the base structure BS. However, the present invention is not necessarily limited thereto, and in another embodiment, the upper wall is formed in a separate process from the side walls of the base structure BS, and may have a structure bonded to the side walls.

In an embodiment, a first height H1 from the upper surface PFM-U of the protective film PFM to the upper surface BS-U of the base structure BS may be lower than a second height H2 from the upper surface PFM-U of the protective film PFM to an upper surface AL-U of the adhesive layer AL. In other words, the adhesive material AD may be applied on the protective film PFM to overflow the inner space BS-I of the base structure BS. In other words, the adhesive material AD may be applied on the protective film PFM to cover the base structure BS. Accordingly, the second height H2 of the entire adhesive layer AL may be higher than the first height H1 of the base structure BS. Accordingly, damage to the base structure BS due to external pressure or the like may be reduced. Accordingly, durability of the adhesive layer AL may be improved.

For example, a ratio of the first height H1 to the second height H2 may be about 0.5 to about 0.8, specifically about 0.7 to about 0.8. When the ratio of the first height H1 to the second height H2 satisfies the above range, durability of the adhesive layer AL may be further improved.

In an embodiment, the first height H1 from the upper surface PFM-U of the protective film PFM to the upper surface BS-U of the base structure BS may be about 10 micrometers to about 30 micrometers, specifically about 15 micrometers to about 30 micrometers. In other words, the height of each of the side walls of the base structure BS may be about 10 micrometers to about 30 micrometers, specifically about 15 micrometers to about 30 micrometers.

Figure 7:
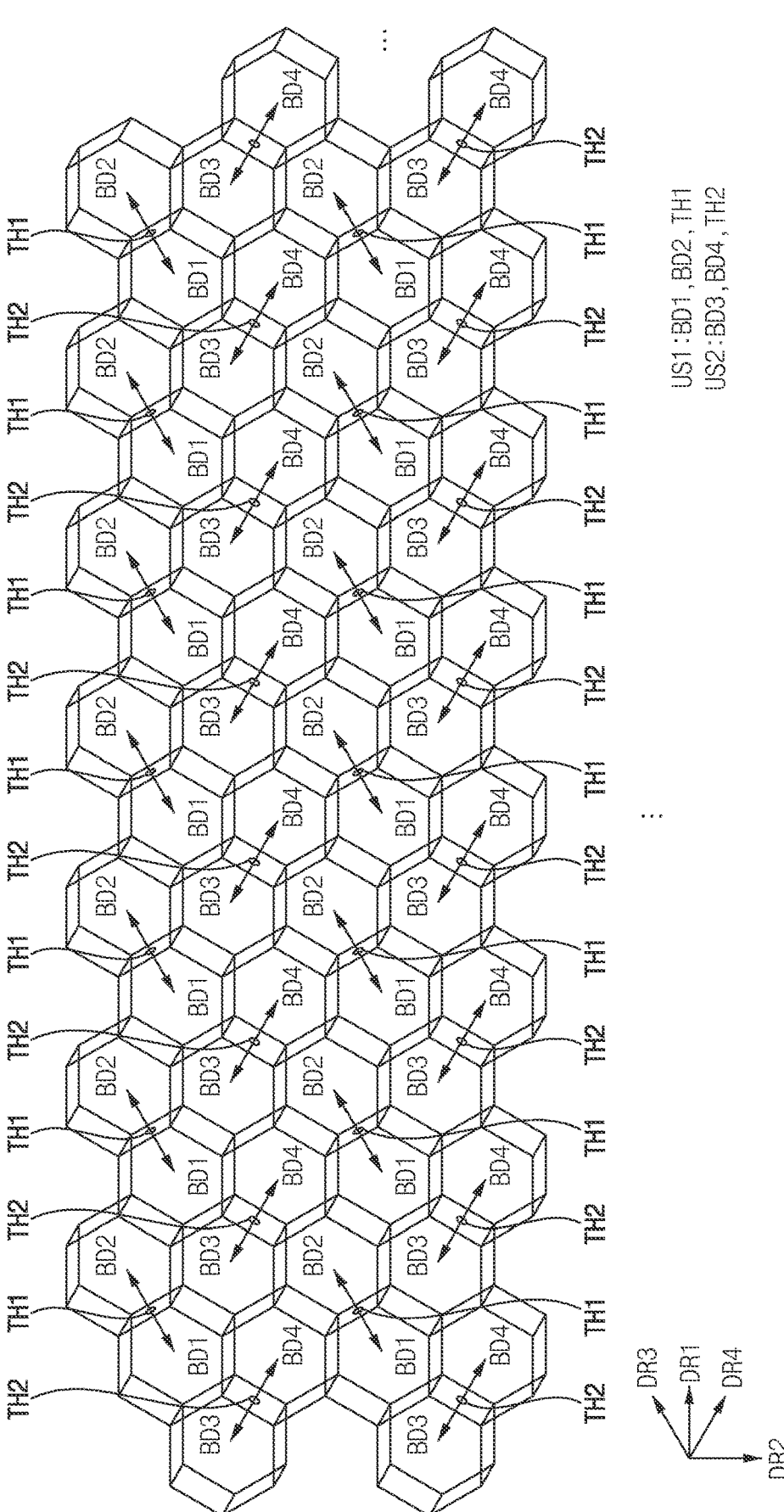
FIG. 7 is a plan view illustrating a base structure included in an adhesive layer of FIG. 6 according to an embodiment.
Figure 8:
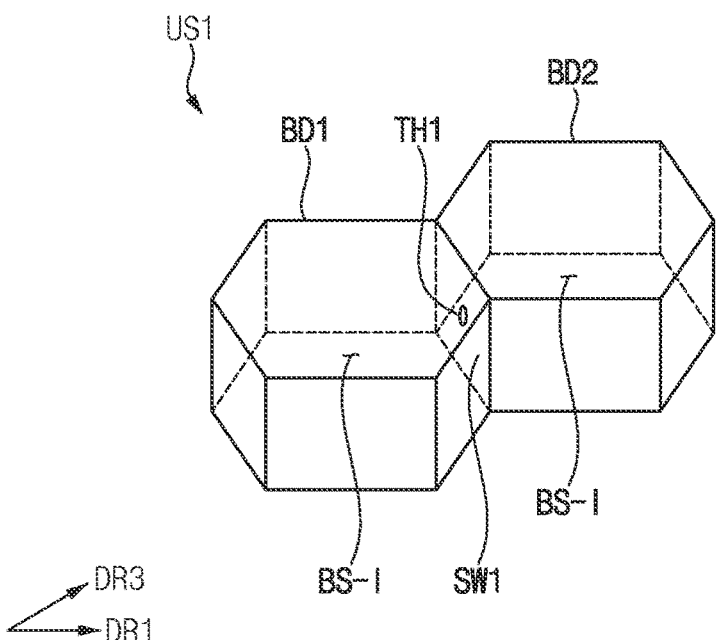
FIG. 8 is a perspective view illustrating a first unit structure included in a base structure of FIG. 7.
Figure 9:
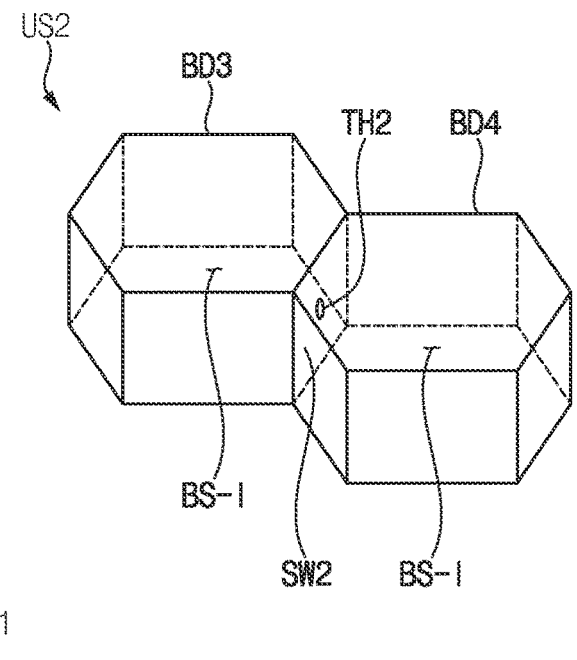
FIG. 9 is a perspective view illustrating a second unit structure included in a base structure of FIG. 7.

FIG. 7 is a plan view illustrating a base structure included in an adhesive layer of FIG. 6 according to an embodiment, FIG. 8 is a perspective view illustrating a first unit structure included in a base structure of FIG. 7, and FIG. 9 is a perspective view illustrating a second unit structure included in a base structure of FIG. 7. As used herein, the "plan view" is a view in a direction perpendicular to a plane defined by the first direction DR1 and the second direction DR2, and a view in a thickness direction of the adhesive layer or the display panel.

Referring to FIGS. 7 to 9, in an embodiment, the base structure BS may include a plurality of first unit structures US1 and a plurality of second unit structures US2.

In an embodiment, each of the first unit structures US1 may include a first body BD1, a second body BD2, and a first through-hole TH1.

In an embodiment, as shown in FIGS. 7 and 8, the first body BD1 and the second body BD2 may be in contact with each other. That is, the first body BD1 and the second body BD2 may be connected to share one side wall. For example, the second body BD2 may extend in the third direction DR3 from a first side wall SW1 of the first body BD1. Accordingly, the second body BD2 may be in contact with the first body BD1 in the third direction DR3 and share the first side wall SW1 with the first body BD1. In this case, the third direction DR3 may be a direction inclined with respect to the first direction DR1 in a plan view. For example, the third direction DR3 may be a direction inclined in a counterclockwise direction with respect to the first direction DR1 in a plan view.

In an embodiment, the first through-hole TH1 may penetrate the first side wall SW1. That is, the first through-hole TH1 may penetrate the first sidewall SW1 shared by the first body BD1 and the second body BD2. Accordingly, the first through-hole TH1 may connect the inner space BS-I of the first body BD1 and the inner space BS-I of the second body BD2. Accordingly, the adhesive material AD in the inner space BS-I of the first body BD1 may flow into the inner space BS-I of the second body BD2 through the first through-hole TH1, and the adhesive material AD in the inner space BS-I of the second body BD2 may flow into the inner space BS-I of the first body BD1 through the first through-hole TH1.

For example, when a certain pressure is applied to the adhesive layer AL, the adhesive material AD in the inner space BS-I of the base structure BS may flow through the first through-hole TH1. For example, since the second body BD2 is in contact with the first body BD1 in the third direction DR3, the adhesive material AD in the inner space BS-I of the first body BD1 may flow in the third direction DR3 through the first through-hole TH1. Also, the adhesive material AD in the inner space BS-I of the second body BD2 may flow in a direction opposite to the third direction DR3 through the first through-hole TH1.

In an embodiment, each of the second unit structures US2 may include a third body BD3, a fourth body BD4, and a second through-hole TH2.

In an embodiment, as shown in FIGS. 7 and 9, the third body BD3 and the fourth body BD4 may be in contact with each other. That is, the third body BD3 and the fourth body BD4 may be connected to share one side wall. For example, the fourth body BD4 may extend in the fourth direction DR4 from a second side wall SW2 of the third body BD3. Accordingly, the fourth body BD4 may be in contact with the third body BD3 in the fourth direction DR4 and share the second side wall SW2 with the third body BD3. In this case, the fourth direction DR4 may be a direction inclined with respect to the first direction DR1 in a plan view. For example, the fourth direction DR4 may be a direction inclined in a clockwise direction with respect to the first direction DR1 in a plan view. For example, the fourth direction DR4 may be a direction symmetrical to the third direction DR3 to be inclined with respect to the first direction DR1 in a plan view.

In an embodiment, the second through-hole TH2 may penetrate the second side wall SW2. That is, the second through-hole TH2 may penetrate the second side wall SW2 shared by the third body BD3 and the fourth body BD4. Accordingly, the second through-hole TH2 may connect the inner space BS-I of the third body BD3 and the inner space BS-I of the fourth body BD4. Accordingly, the adhesive material AD in the inner space BS-I of the third body BD3 may flow into the inner space BS-I of the fourth body BD4 through the second through-hole TH2, and the adhesive material AD in the inner space BS-I of the fourth body BD4 may flow into the inner space BS-I of the third body BD3 through the second through-hole TH2.

For example, when a certain pressure is applied to the adhesive layer AL, the adhesive material AD in the inner space BS-I of the base structure BS may flow through the second through-hole TH2. For example, since the fourth body BD4 is in contact with the third body BD3 in the fourth direction DR4, the adhesive material AD in the inner space BS-I of the third body BD3 may flow in the fourth direction DR4 through the second through-hole TH2. Also, the adhesive material AD in the inner space BS-I of the fourth body BD4 may flow in a direction opposite to the fourth direction DR4 through the second through-hole TH2.

In an embodiment, as shown in FIG. 7, the base structure BS may have a structure in which first unit structures US1 and second unit structures US2 are contact with each other and repeatedly arranged. In other words, the base structure BS may have a structure in which the first to fourth bodies BD1, BD2, BD3, and BD4 are contact with each other and repeatedly arranged.

Accordingly, the base structure BS may have a mesh structure in a plan view. In other words, the base structure BS may have the inner spaces BS-I defined by the mesh structure.

In an embodiment, the mesh structure may have a polygonal shape. In an embodiment, the mesh structure may have a hexagonal shape. That is, each of the first to fourth bodies BD1, BD2, BD3, and BD4 may have a hexagonal column shape, and the mesh structure may have a structure in which hexagonal unit structures are in contact with each other and repeatedly arranged in a plan view. In this case, two sides of the hexagon may be parallel to the first direction DR1.

However, the present invention is not necessarily limited thereto, and in another embodiment, each of the first to fourth bodies BD1, BD2, BD3, and BD4 may have a polygonal columnar shape other than a hexagonal columnar shape. That is, the shape of each of the first to fourth bodies BD1, BD2, BD3, and BD4 doesn't particularly limited if the first to fourth bodies BD1, BD2, BD3, and BD4 can be repeated in contact with each other.

In an embodiment, as the base structure BS has a structure in which the first unit structures US1 and the second unit structures US2 are contact with each other and repeatedly arranged, the first through-hole TH1 and the second through-hole TH2 may be repeatedly arranged in the first direction DR1 and the second direction DR2 in a plan view.

In other words, the first through-hole TH1 and the second through-hole TH2 may be repeatedly arranged in a row direction and a column direction in a plan view. In an embodiment, the first through-hole TH1 and the second through-hole TH2 may be alternately arranged along rows and columns in a plan view.

For example, the first through-hole TH1 may be repeatedly arranged in a first row, and the second through-hole TH2 may be repeatedly arranged in a second row. Also, the second through-hole TH2 may be repeatedly arranged in a first column, and the first through-hole TH1 may be repeatedly arranged in a second column. That is, in an embodiment, the first through-hole TH1 may be repeatedly arranged in odd-numbered rows and even-numbered columns, and the second through-hole TH2 may be repeatedly arranged in even-numbered rows and odd-numbered columns.

Figure 10:
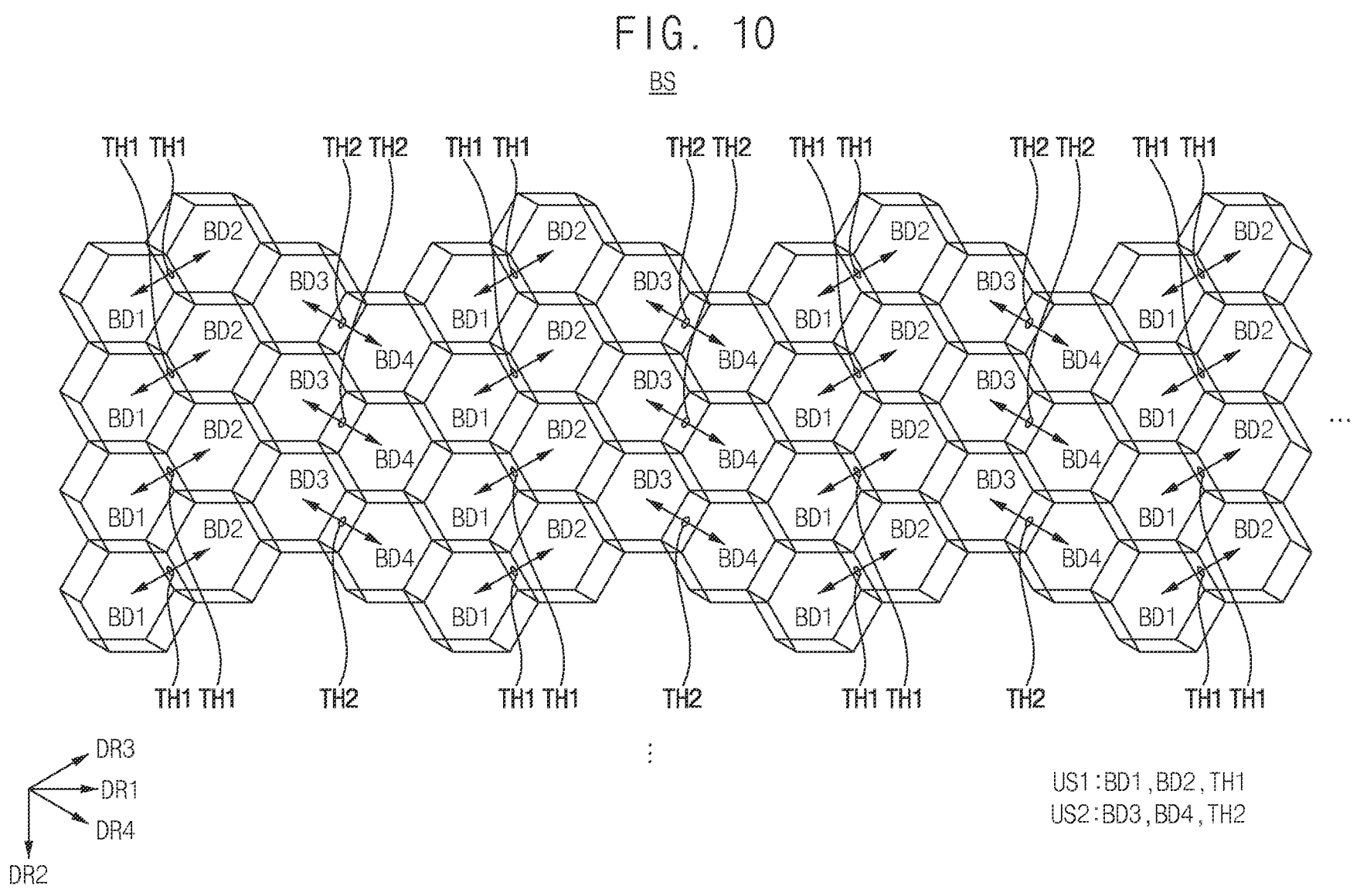

FIG. 10 is a plan view illustrating a base structure included in an adhesive layer of FIG. 6 according to another embodiment.

Referring further to FIG. 10, in another embodiment, the first through-hole TH1 may be repeatedly arranged in the first row, and the second through-hole TH2 may be repeatedly arranged in the second row. In addition, the first through-hole TH1 may be repeatedly arranged in the first column, and the second through-hole TH2 may be repeatedly arranged in the second column. That is, in an embodiment, the first through-hole TH1 may be repeatedly arranged in odd-numbered rows and odd-numbered columns, and the second through-hole TH2 may be repeatedly arranged in even-numbered rows and even-numbered columns.

That is, the arrangement of the first through-hole TH1 and the second through-hole TH2 is not particularly limited as long as the first through-hole TH1 and the second through-hole TH2 are alternately arranged along rows and columns in a plan view.

Referring again to FIGS. 6 to 9, in an embodiment, each of the first through-hole TH1 and the second through-hole TH2 may have a circular shape. However, the present invention is not necessarily limited thereto. For another example, each of the first through-hole TH1 and the second through-hole TH2 may have a polygonal shape such as a diamond shape, a track shape, or an elliptical shape.

As described above, the adhesive material AD in the inner space BS-I of the base structure BS may flow through the first through-hole TH1 and the second through-hole TH2. For example, a certain pressure is applied to the adhesive layer AL, and the adhesive material AD in the inner space BS-I of the base structure BS may flow in the third direction DR3 and in a direction opposite to the third direction DR3 through the first through-hole TH1, and may flow in a fourth direction DR4 and in a direction opposite to the fourth directions DR4 through the second through-hole TH2.

At this time, since the third and fourth directions DR3 and DR4 are symmetrical to each other with respect to the first direction DR1 in a plan view, a flow of the adhesive material AD flowing through the first through-hole TH1 and a flow of the adhesive material AD flowing through the second through-hole TH2 may be symmetrical to each other. That is, the flow of the adhesive material AD through the first through-hole TH1 and the flow through the second through-hole TH2 may offset each other. Accordingly, even when the adhesive material AD flows at each specific point of the adhesive layer AL, the flow of the adhesive material AD may not substantially appear on the entire adhesive layer AL. Accordingly, deformation of the adhesive layer AL due to the flow of the adhesive material AD may be reduced or prevented. Therefore, defects of the display device DD due to deformation of the adhesive layer AL may be reduced or prevented. Accordingly, durability of the display device DD may be effectively improved.

Figure 11:
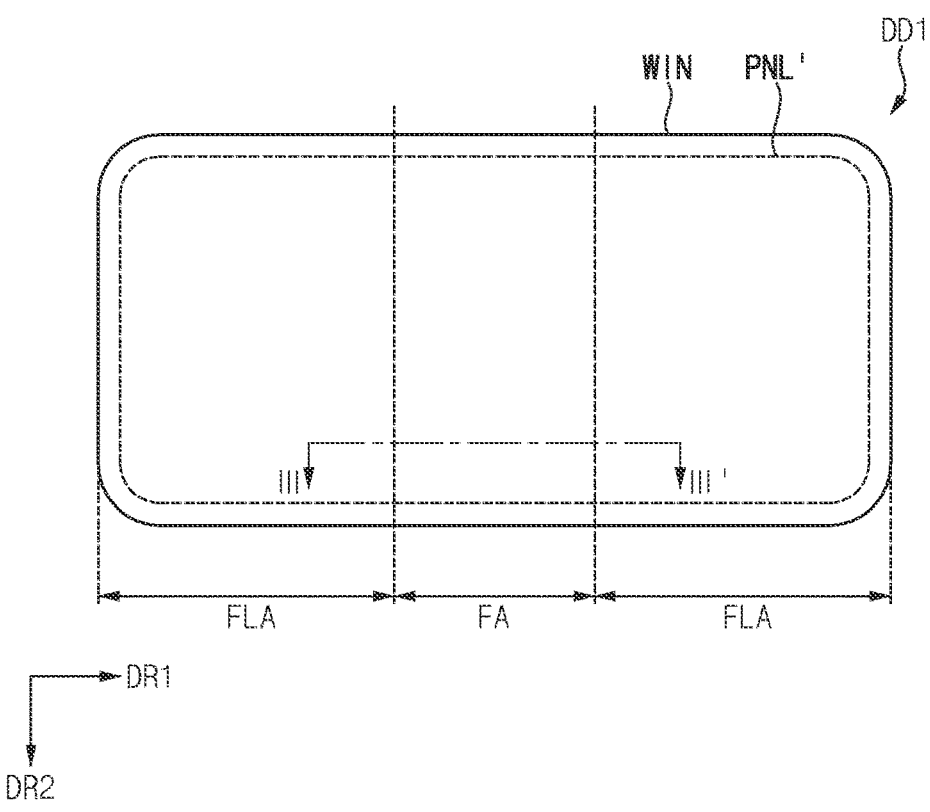
FIGS. 11 and 12 are views illustrating a display device according to another embodiment.
Figure 12:
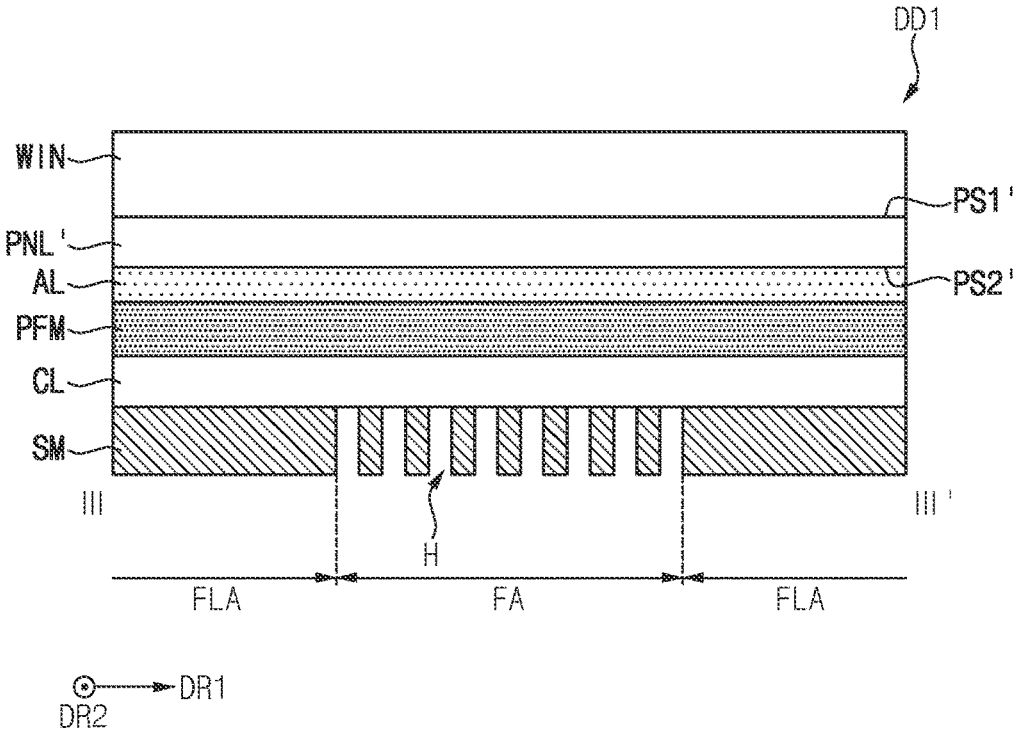

FIGS. 11 and 12 are views illustrating a display device according to another embodiment. For example, FIG. 11 is a plan view illustrating a display device DD1 according to another embodiment, and FIG. 12 is a cross-sectional view taken along line III-III' of FIG. 11.

Referring to FIGS. 11 and 12, in an embodiment, the display device DD1 may include a display panel PNL', a window WIN, a protective film PFM, an adhesive layer AL, a cushion layer CL, and a support member SM. Display device DD1 may be substantially the same as or similar to the structure of the display device DD described with reference to FIGS. 1 to 10 except for the structure of the display panel PNL' and the support member SM. Therefore, repeated descriptions are omitted or simplified.

In an embodiment, the display panel PNL' may include a folding area FA and a flat area FLA adjacent to the folding area FA. For example, as shown in FIG. 11, the display panel PNL' may have the folding area FA overlapping the central portion of the display panel PNL' and the flat area FLA adjacent to the left and right sides of the folding area FA. Accordingly, the display panel PNL' may be folded in the folding area FA.

The window WIN may be disposed on the first surface PS1' of the display panel PNL'. As the display panel PNL' is folded in the folding area FA, the window WIN may be folded in the folding area FA.

The protective film PFM may be disposed on the second surface PS2' of the display panel PNL' opposite to the first surface PS1'. The adhesive layer AL may be disposed between the display panel PNL' and the protective film PFM'. The cushion layer CL may be disposed under the protective film PFM.

The support member SM may be disposed under the cushion layer CL. The support member SM may support the display panel PNL'. For example, the support member SM may include invar, which is an alloy of nickel (Ni) and iron (Fe), stainless steel ("SUS"), titanium (Ti), copper (Cu), or the like. Also, holes H overlapping the folding area FA may be defined in the support member SM.

According to the embodiments, the display device DD1 may be a foldable display device that is folded in the folding area FA, and the adhesive layer AL according to the embodiments may be applied to the foldable display device as well.

Figure 13:
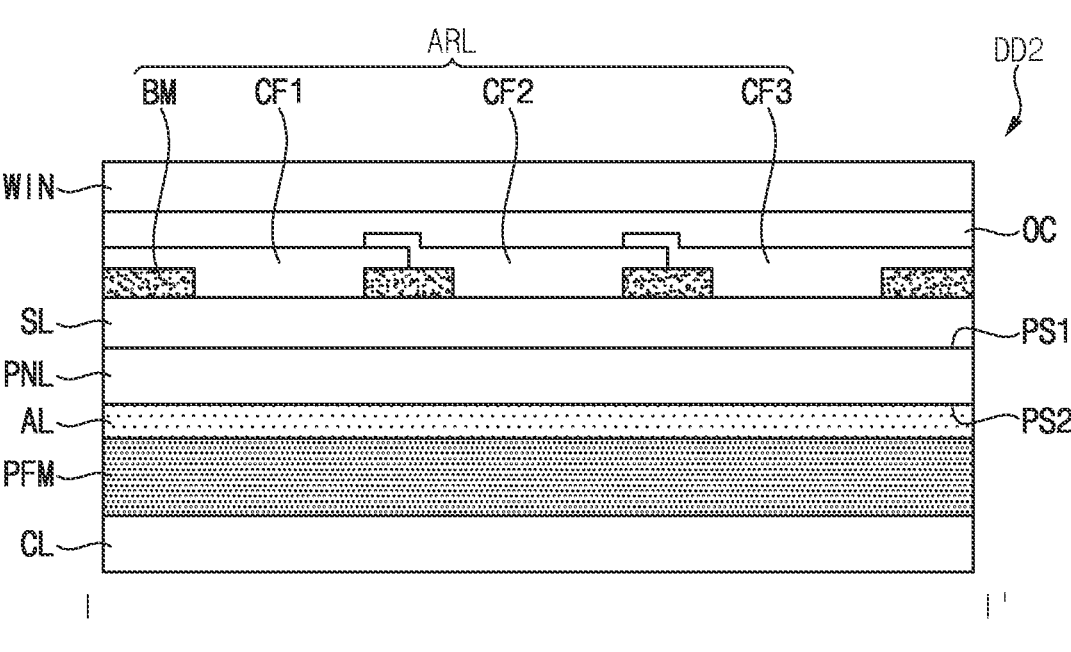
FIG. 13 is a view illustrating a display device according to still another embodiment.

FIG. 13 is a view illustrating a display device according to still another embodiment. For example, FIG. 13 may correspond to the cross-sectional view of FIG. 2.

Referring to FIG. 2, the display device DD2 according to still another embodiment is shown in FIG. 1 may be substantially the same as the display device DD except that the polarization layer POL is omitted and the anti-reflection layer ARL and the overcoat layer OC are included.

In an embodiment, the display device DD2 may include an anti-reflection layer ARL and an overcoat layer OC. In this case, the polarization layer POL described with reference to FIG. 2 may be omitted.

The anti-reflection layer ARL may be disposed on the sensing layer SL. The anti-reflection layer ARL may include a first color filter CF1, a second color filter CF2, a third color filter CF3, and a light blocking member BM.

The light blocking member BM may be disposed on the sensing layer SL. The light blocking member BM may partition areas where the first to third color filters CF1, CF2, and CF3 are disposed. That is, the light blocking member BM may be disposed between the first to third color filters CF1, CF2, and CF3. The light blocking member BM may absorb and/or block light. For example, examples of materials that can be used as the light blocking member BM may include chromium and chromium oxide.

The first to third color filters CF1, CF2, and CF3 may be disposed on the sensing layer SL. Each of the first to third color filters CF1, CF2, and CF3 may selectively transmit light of a specific wavelength range. For example, each of the first to third color filters CF1, CF2, and CF3 may selectively transmit light of different wavelengths.

The overcoat layer OC may be disposed on the anti-reflection layer ARL. The overcoat layer OC may include an organic material and/or an inorganic material. For example, examples of materials that can be used as the overcoat layer OC may include polyimide, acryl, silicon oxide, or silicon nitride.

According to embodiments, since the display device DD2 includes the anti-reflection layer ARL and the overcoat layer OC, the polarization layer POL may be omitted. That is, the anti-reflection layer ARL and the overcoat layer OC may replace the polarization layer POL. Accordingly, the weight and/or thickness of the display device DD2 may be reduced, and the stacked structure of the display device DD2 may be further simplified.

According to embodiments, the display device may include the protective film PFM and the adhesive layer AL disposed under the display panel. In addition, the adhesive layer AL may include the base structure BS and the adhesive material AD, and the base structure BS may have the first through-hole TH1 and the second through-hole TH2 through which the adhesive material AD flows in a specific direction. The first through-hole TH1 and the second through-hole TH2 may allow the adhesive material AD to flow symmetrically with each other. Accordingly, even when the adhesive material AD flows, the flow of the adhesive material AD may not substantially appear on the entire adhesive layer AL. Accordingly, deformation of the adhesive layer AL may be reduced or prevented. Therefore, defects of the display device DD due to deformation of the adhesive layer AL may be reduced or prevented. Accordingly, durability of the display device DD may be improved.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
a display panel;
a protective film disposed under the display panel; and
an adhesive layer disposed between the display panel and the protective film,
wherein the adhesive layer includes:
    a base structure including a plurality of first unit structures and a plurality of second unit structures; and
    an adhesive material filling an inner space of the base structure,
wherein each of the first unit structures includes a first body, a second body in contact with the first body, and a first through-hole penetrating a side wall shared by the first body and the second body, and
wherein each of the second unit structures includes a third body, a fourth body in contact with the third body, and a second through-hole penetrating a side wall shared by the third body and the fourth body.

2. The display device of claim 1, wherein the first unit structures and the second unit structures are disposed such that the first through-holes and the second through-holes are repeatedly arranged in a first direction and a second direction perpendicular to the first direction in a plan view.

3. The display device of claim 2, wherein the first through-holes and the second through-holes are alternately arranged along rows and columns in a plan view.

4. The display device of claim 2, wherein the adhesive material flows through the first through-hole and the second through-hole.

5. The display device of claim 4, wherein the second body is in contact with the first body in a third direction inclined with respect to the first direction in a plan view, and
wherein the fourth body is in contact with the third body in a fourth direction inclined with respect to the first direction to be symmetrical to the third direction in a plan view.

6. The display device of claim 5, wherein the adhesive material flows in the third direction and in a direction opposite to the third direction through the first through-hole, and flows in the fourth direction and in a direction opposite to the fourth direction through the second through-hole.

7. The display device of claim 1, wherein a first height from an upper surface of the protective film to an upper surface of the base structure is lower than a second height from the upper surface of the protective film to an upper surface of the adhesive layer.

8. The display device of claim 7, wherein a ratio of the first height to the second height is about 0.5 to about 0.8.

9. The display device of claim 1, wherein the base structure has a structure in which a portion corresponding to the inner space among an upper surface of the base structure is opened.

10. The display device of claim 1, wherein the base structure includes a same material as the protective film.

11. The display device of claim 1, wherein the base structure is monolithic with the protective film.

12. The display device of claim 1, wherein the base structure has a mesh structure in a plan view.

13. The display device of claim 12, wherein the mesh structure has a polygonal shape.

14. The display device of claim 13, wherein the polygonal shape is a hexagonal shape.

15. The display device of claim 1, wherein each of the first through-hole and the second through-hole has a polygonal shape, a circular shape, a track shape, or an elliptical shape.

16. The display device of claim 1, wherein the display panel includes a display area, a pad area spaced apart from the display area, and a bending area located between the display area and the pad area and bent from the display area.

17. The display device of claim 16, further comprising:
a sensing layer disposed on a first surface of the display panel and overlapping the display area; and
a pad part disposed on the first surface of the display panel and overlapping the pad area, and
wherein the protective film is disposed on a second surface of the display panel opposite to the first surface.

18. The display device of claim 17, wherein the display panel includes:
a transistor electrically connected to the pad part;
a pixel electrode disposed on the transistor and connected to the transistor;
an emission layer disposed on the pixel electrode;
a common electrode disposed on the emission layer; and
an encapsulation layer disposed on the common electrode and including at least one inorganic encapsulation layer and at least one organic encapsulation layer.

19. The display device of claim 1, wherein the display panel includes a folding area and a flat area adjacent to the folding area.

20. The display device of claim 19, further comprising a support member disposed under the protective film and having a plurality of holes overlapping the folding area.

* * * * *